United States Patent
Yun et al.

(10) Patent No.: US 12,360,574 B2
(45) Date of Patent: Jul. 15, 2025

(54) FOLDABLE DISPLAY DEVICE

(71) Applicant: LG Display Co., Ltd., Seoul (KR)

(72) Inventors: Youngjoon Yun, Goyang-si (KR); Seungo Jeon, Seoul (KR); Shinsuk Lee, Gimpo-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 18/213,684

(22) Filed: Jun. 23, 2023

(65) Prior Publication Data

US 2023/0337381 A1 Oct. 19, 2023

Related U.S. Application Data

(63) Continuation of application No. 17/539,829, filed on Dec. 1, 2021, now Pat. No. 11,729,932.

(30) Foreign Application Priority Data

Dec. 28, 2020 (KR) .......................... 10-2020-0184527

(51) Int. Cl.
| | |
|---|---|
| *H05K 5/00* | (2025.01) |
| *G06F 1/16* | (2006.01) |
| *H05K 5/02* | (2006.01) |
| *E05D 3/12* | (2006.01) |

(52) U.S. Cl.
CPC ......... *H05K 5/0226* (2013.01); *G06F 1/1641* (2013.01); *G06F 1/1681* (2013.01); *H05K 5/0017* (2013.01); *E05D 3/122* (2013.01); *E05Y 2999/00* (2024.05)

(58) Field of Classification Search
None
See application file for complete search history.

(56) References Cited

U.S. PATENT DOCUMENTS

| | | | |
|---|---|---|---|
| 10,028,395 B2 * | 7/2018 | Chen ...................... | G06F 1/1626 |
| 11,044,825 B1 * | 6/2021 | Han ...................... | H05K 5/0017 |
| 11,194,366 B2 | 12/2021 | Cheng | |
| 11,252,833 B2 * | 2/2022 | Yen ...................... | H04M 1/022 |

(Continued)

FOREIGN PATENT DOCUMENTS

KR 10-2020-0081639 A 7/2020

*Primary Examiner* — Anthony Q Edwards
*Assistant Examiner* — Rashen E Morrison
(74) *Attorney, Agent, or Firm* — Birch, Stewart, Kolasch & Birch, LLP (57) ABSTRACT

An example of a foldable display device includes a display panel having a first area, a second area, and a foldable area therebetween; a first support plate supporting the first area of the display panel; a second support plate supporting the second area of the display panel; a central support disposed under the foldable area of the display panel and configured to move vertically; a first peripheral support slidable while supporting the first support plate; a second peripheral support slidable while supporting the second support plate; and a hinge body disposed under the central support. The central support ascends toward the display panel during an unfolding operation and descends toward the hinge body during an in-folding operation. The first peripheral support and the second peripheral support move toward the central support during the unfolding operation, and move away from the central support during the in-folding operation.

16 Claims, 9 Drawing Sheets

(56) References Cited

U.S. PATENT DOCUMENTS

| | | | |
|---|---|---|---|
| 11,385,686 B2* | 7/2022 | Ai | G06F 1/1616 |
| 11,778,764 B2* | 10/2023 | Zhang | G06F 1/1681 |
| | | | 361/807 |
| 2015/0366089 A1* | 12/2015 | Park | H04M 1/0268 |
| | | | 361/679.01 |
| 2018/0146560 A1* | 5/2018 | Chen | G06F 1/1626 |
| 2018/0341295 A1 | 11/2018 | Lan et al. | |
| 2019/0179373 A1 | 6/2019 | Cheng et al. | |
| 2020/0166974 A1* | 5/2020 | Ai | H04M 1/0216 |
| 2022/0075411 A1 | 3/2022 | Lee et al. | |

* cited by examiner

FOLDABLE DISPLAY DEVICE

CROSS-REFERENCE TO RELATED APPLICATIONS

This application is a Continuation Application of U.S. application Ser. No. 17/539,829, filed on Dec. 1, 2021, which claims a priority benefit under 35 U.S.C. § 119(a) of Korean Patent Application No. 10-2020-0184527 filed on Dec. 28, 2020 in the Republic of Korea, the entire contents of all these applications being hereby expressly incorporated by reference into the present application.

BACKGROUND

Field

The present disclosure relates to a foldable display device, and, more particularly, to a foldable display device having movable supports that can support a display panel.

Description of the Related Art

Recently, portable terminals such as wireless terminals, PDA (Personal Digital Assistants), PMPs (Portable Multimedia Players), and electronic notebooks have become smaller in size for convenience in portability. However, since a user wants to receive various information such as text information, a moving image, a still image, MP3, game, etc. on a screen of a portable terminal, there is an increasing demand for the screen size to increase.

In order to meet all the enlargement of the screen while maintaining the portability of the portable terminal, development of a foldable display device using a flexible display panel that can be bent or folded is in progress. This foldable display device can be applied not only to mobile devices such as mobile phones, electronic books, and electronic newspapers, but also to various fields such as televisions and monitors.

SUMMARY OF THE DISCLOSURE

In a foldable display device implemented in an in-foldable manner in which the foldable display device is folded such that folded display panel portions face toward each other according to a related art, the length of a flip-flop supporting the display panel is small, such that a partial area of the display panel may not be supported during an unfolding operation. Thus, a touch sensitivity of the partial area of the display panel can be lowered and a durability thereof can be weakened. A stress applied to the display panel can increase due to a narrow space to receive the display panel during an in-folding operation.

Accordingly, the inventors of the present disclosure have invented a foldable display device that supports an entire area of the display panel during the unfolding operation and secures a sufficient space for receiving the display panel during the in-folding operation.

A purpose of the present disclosure is to provide a foldable display device having movable supports that can support the entire area of the display panel during the unfolding operation and minimize the stress applied to the display panel during the in-folding operation.

Purposes according to the present disclosure are not limited to the above-mentioned purpose. Other purposes and advantages according to the present disclosure that are not mentioned can be understood based on following descriptions, and can be more clearly understood based on embodiments according to the present disclosure. Further, it will be easily understood that the purposes and advantages according to the present disclosure can be realized using means shown in the claims and combinations thereof.

In order to achieve the above-described purpose and other objects, a foldable display device according to one embodiment of the present disclosure includes a display panel having a first area, a second area, and a foldable area therebetween, a first support plate supporting the first area of the display panel, a second support plate supporting the second area of the display panel, a central support that is disposed under a foldable area of the display panel and moves up and down, a first peripheral support that slides while supporting the first support plate, a second peripheral support that slides while supporting the second support plate, and a hinge body disposed under the central support. When the first casing and the second casing pivot around the hinge body so that the display panel is unfolded, for example, during the unfolding operation, the first peripheral support and the second peripheral support become closer to the central support, and the central support ascends towards the display panel to support the display panel. In one example, when the first casing and the second casing pivot around the hinge body so that the display panel is folded, for example, during the in-folding operation, the first peripheral support and the second peripheral support can move away from the central support, and the central support does not support the display panel and can descend toward the hinge body.

According to one or more embodiments of the present disclosure, the foldable display device includes the central support that ascends toward the display panel during the unfolding operation, and the first peripheral support and the second peripheral support that move toward the central support during the unfolding operation, such that the entire area of the display panel can be supported during the unfolding operation.

According to one or more embodiments of the present disclosure, the foldable display device includes the central support that descends toward the hinge body during the in-folding operation, and the first peripheral support and the second peripheral support moving away from the central support during the in-folding operation, such that a space that can accommodate therein a smoothly bent display panel during the in-folding operation can be secured.

According to one or more embodiments of the present disclosure, a supporting device includes a first support plate supporting a first area of a display panel; a second support plate supporting a second area of the display panel; a central support disposed under a foldable area between the first area and the second area of the display panel and configured to move vertically; a first peripheral support slidable while supporting the first support plate; a second peripheral support slidable while supporting the second support plate; and a hinge body disposed under the central support, wherein the central support ascends toward the display panel during an unfolding operation and descends toward the hinge body during an in-folding operation, wherein the first peripheral support and the second peripheral support move toward the central support during the unfolding operation, and move away from the central support during the in-folding operation.

According to one or more embodiments of the present disclosure, a supporting device includes a central support disposed under a foldable area of a display panel and configured to move vertically; a first peripheral support slidably disposed on one side of the central support; a second peripheral support slidably disposed on an opposite side of the central support; and a hinge body disposed under the central support, wherein the central support ascends toward the display panel during an unfolding operation and descends toward the hinge body during an in-folding operation, wherein the first peripheral support and the second peripheral support move toward the central support during the unfolding operation and move away from the central support during the in-folding operation.

Effects of the present disclosure are not limited to the above-mentioned effects, and other effects as not mentioned will be clearly understood by those skilled in the art from following descriptions.

DETAILED DESCRIPTION OF THE EMBODIMENTS

Advantages and features of the present disclosure, and a method of achieving the Advantages and features will become apparent with reference to embodiments described later in detail together with the accompanying drawings. However, the present disclosure is not limited to the embodiments as disclosed below, but can be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure can be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one of" when preceding a list of elements can modify the entire list of elements and may not modify the individual elements of the list. In interpretation of numerical values, an error or tolerance therein can occur even when there is no explicit description thereof.

In addition, it will also be understood that when a first element or layer is referred to as being present "on" a second element or layer, the first element can be disposed directly on the second element or can be disposed indirectly on the second element with a third element or layer being disposed between the first and second elements or layers. It will be understood that when an element or layer is referred to as being "connected to", or "coupled to" another element or layer, it can be directly on, connected to, or coupled to the other element or layer, or one or more intervening elements or layers can be present. In addition, it will also be understood that when an element or layer is referred to as being "between" two elements or layers, it can be the only element or layer between the two elements or layers, or one or more intervening elements or layers can also be present.

Further, as used herein, when a layer, film, region, plate, or the like is disposed "on" or "on a top" of another layer, film, region, plate, or the like, the former can directly contact the latter or still another layer, film, region, plate, or the like can be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former can directly contact the latter or still another layer, film, region, plate, or the like can be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event can occur therebetween unless "directly after", "directly subsequent" or "directly before" is indicated.

It will be understood that, although the terms "first", "second", "third", and so on can be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure can be partially or entirely combined with each other, and can be technically associated with each other or operate with each other. The embodiments can be implemented independently of each other and can be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, a foldable display device according to embodiments of the present disclosure will be described.

A foldable display device according to one embodiment of the present disclosure includes a first support plate supporting a first area of a display panel, a second support plate supporting a second area of the display panel, a central support that is disposed under a foldable area of the display panel and moves up and down, a first peripheral support that slides while supporting the first support plate, a second peripheral support that slides while supporting the second support plate, and a hinge body disposed under the central support. When the first casing and the second casing pivot around the hinge body so that the display panel is unfolded, for example, during the unfolding operation, the first peripheral support and the second peripheral support become closer to the central support, and the central support ascends towards the display panel to support the display panel. In one example, when the first casing and the second casing pivot around the hinge body so that the display panel is folded, for example, during the in-folding operation, the first peripheral support and the second peripheral support can move away from the central support, and the central support does not support the display panel and can descend toward the hinge body.

Thus, the foldable display device includes the central support that ascends toward the display panel during the unfolding operation, and the first peripheral support and the second peripheral support that move toward the central support during the unfolding operation, such that the entire area of the display panel can be supported during the unfolding operation.

Further, the foldable display device includes the central support that descends toward the hinge body during the in-folding operation, and the first peripheral support and the second peripheral support moving away from the central support during the in-folding operation, such that a space that can accommodate therein a smoothly bent display panel during the in-folding operation can be secured.

Figure 1:
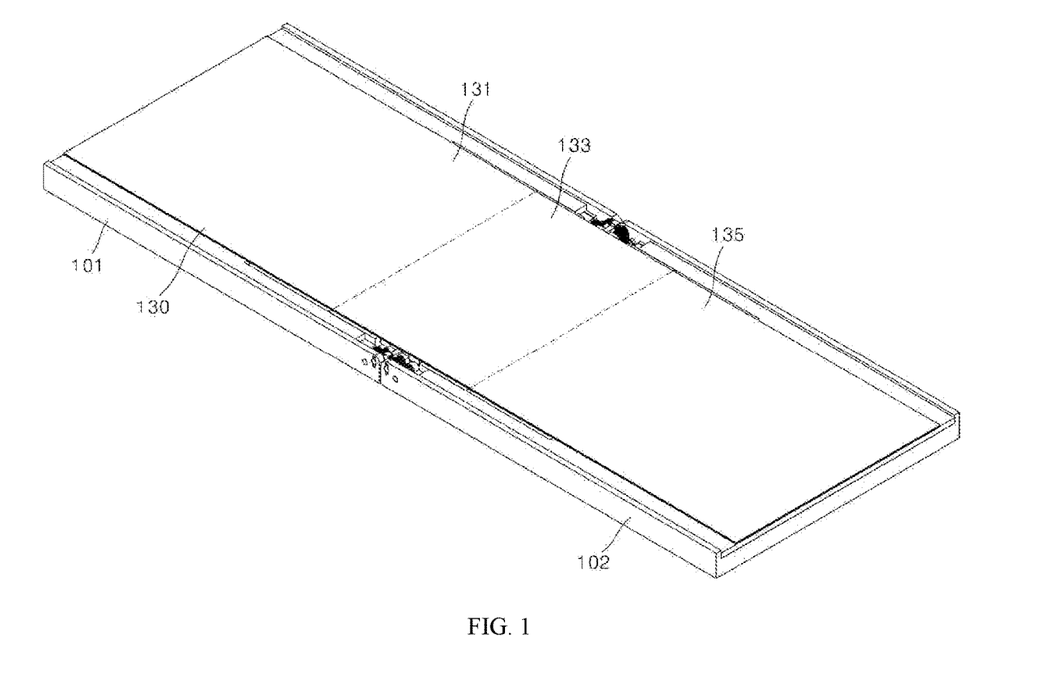
FIG. 1 is a perspective view of a foldable display device according to one embodiment of the present disclosure as viewed in an unfolded state.
Figure 2:
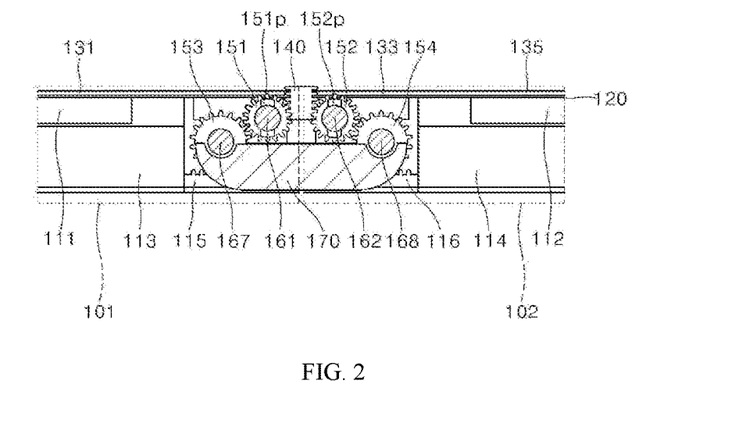
FIG. 2 is a side view of a portion of a foldable display device according to one embodiment of the present disclosure as viewed in an unfolded state.
Figure 3:
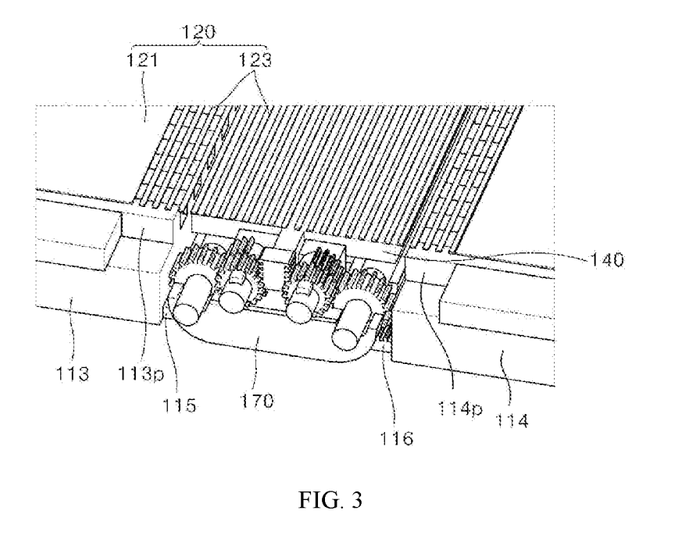
FIG. 3 is a perspective view showing a partial area of a foldable display device according to one embodiment of the present disclosure in an unfolded state while a display panel is removed.
Figure 4:
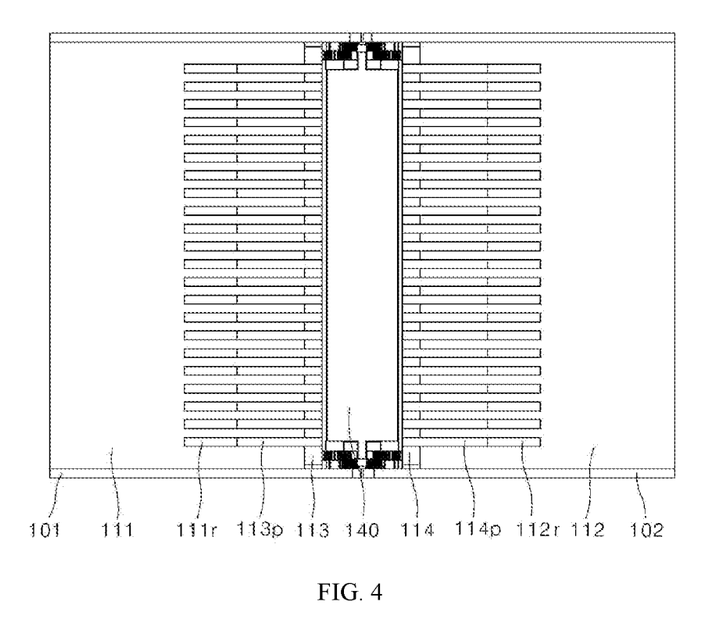
FIG. 4 is a plan view showing an arrangement of supports and gears of a foldable display device according to one embodiment of the present disclosure in an unfolded state.

FIG. 1 is a perspective view of a foldable display device according to one embodiment of the present disclosure as viewed in an unfolded state. FIG. 2 is a side view of a portion of a foldable display device according to one embodiment of the present disclosure viewed in the unfolded state. FIG. 3 is a perspective view showing a partial area of a foldable display device according to one embodiment of the present disclosure in an unfolded state when a display panel is removed. FIG. 4 is a plan view showing an arrangement of supports and gears of a foldable display device according to one embodiment of the present disclosure in an unfolded state. All the components of each foldable display device according to all embodiments of the present disclosure are operatively coupled and configured.

Referring to FIG. 1 to FIG. 4, a foldable display device according to one embodiment of the present disclosure includes a first casing 101, a second casing 102, a first support plate 111, a first peripheral support 113, a second support plate 112, a second peripheral support 114, a first rack gear 115, a second rack gear 116, a display panel 130, a central support 140, a first rotatable gear 151, a second rotatable gear 152, a third rotatable gear 153, a fourth rotatable gear 154, and a hinge body 170.

An entire area of the display panel 130 can be divided into a first area 131, a second area 135, and a foldable area 133. The first area 131 can be defined as a partial area of the display panel 130 located on one side of the foldable area 133. The second area 135 can be defined as a partial area of the display panel 130 located on an opposite side of the foldable area 133. When the display panel 130 is unfolded into a flat state, the first area 131, the second area 135, and the foldable area 133 constitute a single display area, thereby providing a wide screen.

The display panel 130 can be embodied as a flexible display panel using a flexible substrate. In one example, the display panel 130 can include a flexible organic light-emitting display panel, a flexible electrophoretic display panel, a flexible liquid crystal display panel, or a flexible electron-wetting display panel.

The display panel 130 can include a flexible pixel array substrate having an active matrix type pixel array, and an encapsulating member protecting the pixel array. The flexible pixel array substrate can be made of a plastic material or can be made of a metal foil. For example, the plastic flexible pixel array substrate can be made of one selected from PI (Polyimide), PET (Polyethyleneterephthalate), PEN (Polyethylenapthanate), PC (Polycarbonate), PNB (Polynorborneec), and PES (Polyethersulfone). The pixel array includes a plurality of pixels in each pixel area adjacent to each of intersections between a plurality of gate lines and a plurality of data lines. The pixel includes a display element that displays an image corresponding to an image signal. In this connection, the display element can be embodied as an organic light-emitting element, a liquid crystal display element, an electrophoretic element, or an electro-wetting display element. When the display element is embodied as an organic light-emitting element or an electrophoretic element, an encapsulating member according to one example can be formed on a flexible substrate to cover the pixel array, and can be embodied as a flexible encapsulating substrate or a flexible encapsulation layer. When the display element is embodied as a liquid crystal display element, an electro-wetting display element, or an electrophoretic element, an encapsulating member according to another example can be embodied as a flexible color filter substrate including a color filter corresponding to a pixel.

Additionally, the display panel 130 can further include a polarizing film attached to the encapsulating member. However, the polarizing film can be omitted depending on an image rendering scheme of the display panel 130.

In one example, the foldable display device according to one embodiment of the present disclosure can be configured to further include a touch screen for a user interface using a user's touch. The touch screen can be attached to the display panel 130 or embedded in the display panel 130 together with a pixel array.

A backplate layer 120 can be attached to a bottom face of the display panel 130 to reinforce rigidity of the display panel 130. The backplate layer 120 can include a non-patterned portion 121 attached to the first and second areas 131 and 135 of the display panel 130 and a patterned portion 123 attached to the foldable area 133 of the display panel 130. The patterned portion 123 can be composed of a plurality of segments arranged side by side by a predefined spacing. As a result, the rigidity of the display panel 130 can be enhanced while maintaining a folding property of the foldable area 133 of the display panel 130.

The non-patterned portion 121 of the backplate layer 120 attached to the bottom face of the first area 131 of the display panel 130 can be attached to the first support plate 111. The non-patterned portion 121 of the backplate layer 120 attached to the bottom face of the second area 135 of the display panel 130 can be attached to the second support plate 112. The first support plate 111 can support the first area 131 of the display panel 130 via the backplate layer 120, while the second support plate 112 can support the second area 135 of the display panel 130 via the backplate layer 120. Alternatively, in one embodiment, the bottom face of the first area 131 of the display panel 130 can be attached directly to the first support plate 111 without the backplate layer 120, while the bottom face of the second area 135 of the display panel 130 can be attached directly to the second support plate 112 without the backplate layer 120. For example, the first support plate 111 can directly support the first area 131 of the display panel 130, while the second support plate 112 can directly support the second area 135 of the display panel 130.

Referring to FIGS. 2 and 4, the first support plate 111 can be supported by the first casing 101 and the first peripheral support 113. A portion of the first support plate 111 can be flat and can be attached to the first casing 101 and supported by the first casing 101. The remaining portion of the first support plate 111 can have first guide grooves 111r defined therein arranged side by side and can be supported by the first peripheral support 113. The remaining portion of the first support plate 111 having the first guide grooves 111r defined therein can be supported by the first peripheral support 113 while first slidable bars 113p provided on a top face of the first peripheral support 113 are respectively slidably fitted to the first guide grooves 111r of the first support plate 111. For example, the first peripheral support 113 supports the first support plate 111 and can slide within the first casing 101 under guidance of the first guide grooves 111r. The first casing 101 can accommodate the first support plate 111 and the first peripheral support 113.

The second support plate 112 can be supported by the second casing 102 and the second peripheral support 114. A portion of the second support plate 112 can be flat and can be attached to the second casing 102 and supported by the second casing 102. The remaining portion of the second support plate 112 can be supported by the second peripheral support 114 and can have second guide grooves 112r defined therein arranged side by side. The remaining portion of the second support plate 112 having the second guide grooves 112r can be supported by the second peripheral support 114 while second slidable bars 114p provided on a top face of the second peripheral support 114 are respectively slidably fitted to the second guide grooves 112r of the second support plate 112. For example, the second peripheral support 114 can support the second support plate 112 and can slide within the second casing 102 under guidance of the second guide grooves 112r. The second casing 102 can accommodate the second support plate 112 and the second peripheral support 114.

Referring to FIG. 3, in the unfolded state, a central area of the patterned portion 123 of the backplate layer 120 attached to the bottom face of the foldable area 133 of the display panel 130 can be supported by the central support 140. In the unfolded state, the central area of the foldable area 133 of the display panel 130 can be supported by the central support 140 via the backplate layer 120.

Segments of a first peripheral area (left area on the central area) of the patterned portion 123 of the backplate layer 120 can extend perpendicularly to the first slidable bars 113p of the first peripheral support 113 to more firmly support a first peripheral area of the foldable area 133 of the display panel 130. Similarly, segments of a second peripheral area (right area on the central area) of the patterned portion 123 of the backplate layer 120 can extend perpendicularly to the second slidable bars 114p of the second peripheral support 114 to more firmly support a second peripheral area of the foldable area 133 of the display panel 130.

The central support 140 can support the display panel 130 while being vertically spaced from the hinge body 170. In the drawing in FIG. 2, in the unfolding operation, in a process of pivoting the first casing 101 and the second casing 102 around the hinge body 170 so that the display panel 130 is unfolded, the first rotatable gear 151 rotates counterclockwise around a first hinge shaft 161 and the second rotatable gear 152 rotates clockwise around a second hinge shaft 162, such that the central support 140 ascends from the hinge body 170 towards the display panel 130. This ascending motion of the central support 140 will be described later with reference to FIG. 8.

Rotation mechanism of each of the first rotatable gear 151 and the second rotatable gear 152 will be described. The first rotatable gear 151 has a first protrusion 151p on one side face thereof. The first protrusion 151p of the first rotatable gear 151 is fitted into a groove having a shape corresponding to a shape of the first protrusion 151p and defined in the first casing 101. Thus, the first rotatable gear 151 can rotate only by the same angle as a pivoting angle of the first casing 101 according to a pivoting motion of the first casing 101. The second rotatable gear 152 has a second protrusion 152p on one side face thereof. The second protrusion 152p of the second rotatable gear 152 is fitted into a groove having a shape corresponding to a shape the second protrusion 152p and defined in the second casing 102. Thus, the second rotatable gear 152 can rotate only by the same angle as a pivoting angle of the second casing 102 according to a pivoting motion of the second casing 102.

The first peripheral support 113 and the second peripheral support 114 can support the display panel 130 while being positioned adjacent to the central support 140. Based on the drawing in FIG. 2, in the unfolding operation, in the process of pivoting the first casing 101 and second casing 102 around the hinge body 170 so that the display panel 130 is unfolded, the third rotatable gear 153 rotates counterclockwise around a first rotation shaft 167, such that the first peripheral support 113 connected to the first rack gear 115 is pulled toward the central support 140. At the same time, the fourth rotatable gear 154 rotates clockwise around a second rotation shaft 168, such that the second peripheral support 114 connected to the second rack gear 116 is pulled toward the central support 140.

Rotation mechanism of each of the third rotatable gear 153 and the fourth rotatable gear 154 will be described. The third rotatable gear 153 is engaged with teeth of the first hinge shaft support 173 of the hinge body 170. Thus, in the unfolding operation, when the first casing 101 pivots counterclockwise around the hinge body 170, the third rotatable gear 153 rotates counterclockwise. The fourth rotatable gear 154 is engaged with teeth of the second hinge shaft support 174 of the hinge body 170. Thus, in the unfolding operation, when the second casing 102 pivots clockwise around the hinge body 170, the fourth rotatable gear 154 rotates clockwise.

Figure 5:
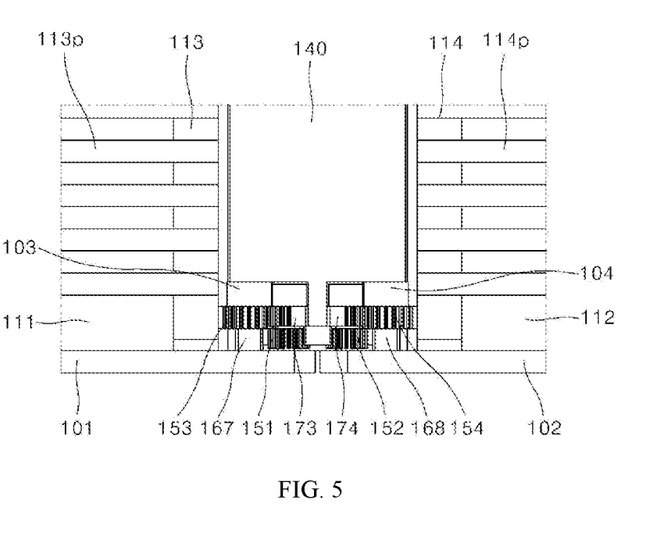
FIG. 5 is an enlarged view of a partial area of FIG. 4, and is a plan view showing an arrangement of gears of a foldable display device according to one embodiment of the present disclosure.
Figure 6:
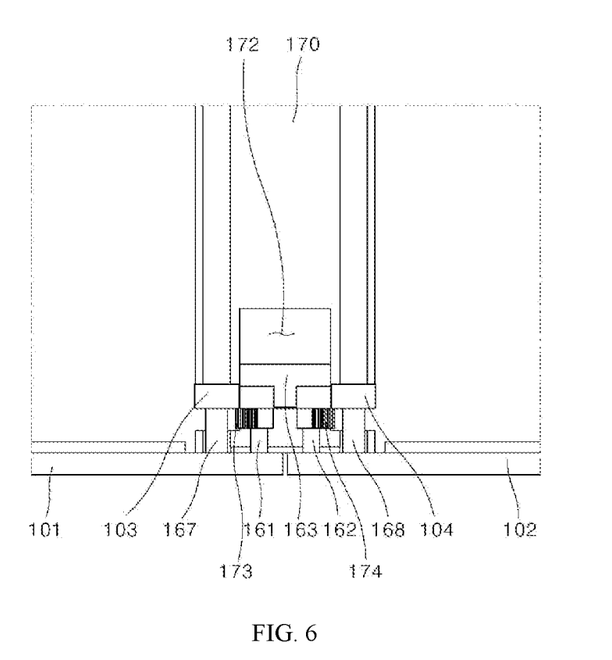
FIG. 6 is a plan view showing an arrangement of hinge shafts and rotation shafts of a foldable display device according to one embodiment of the present disclosure.

FIG. 5 is a plan view showing an arrangement of gears of a foldable display device according to one embodiment of the present disclosure. FIG. 6 is a plan view showing an arrangement of hinge shafts and rotation shafts of a foldable display device according to one embodiment of the present disclosure.

Referring to FIG. 5 and FIG. 6, the first hinge shaft 161 passes through the first hinge shaft support 173 of the hinge body 170 and is coupled to a side wall of the first casing 101. The second hinge shaft 162 passes through the second hinge shaft support 174 of the hinge body 170 and is attached to a side wall of the second casing 102. The first rotatable gear 151 is disposed between the side wall of the first casing 101 and the first hinge shaft support 173 and is rotatably fitted to the first hinge shaft 161. The second rotatable gear 152 is disposed between the side wall of the second casing 102 and the second hinge shaft support 174 and is rotatably fitted to the second hinge shaft 162. The first casing 101 can be pivotally coupled to the hinge body 170 via the first hinge shaft 161, while the second casing 102 can be pivotally coupled to the hinge body 170 via the second hinge shaft 162. The first hinge shaft 161 and the second hinge shaft 162 can extend in a horizontal direction from a hinge shaft fixing portion 163 received in the hinge body 170. The hinge shaft fixing portion 163 can be fitted into the groove 172 of the hinge body 170.

The first rotation shaft 167 can be coupled to a first rotation shaft support 103 protruding from a bottom of the first casing 101 and a side wall of the first casing 101. The second rotation shaft 168 can be coupled to a second rotation shaft support 104 protruding from a bottom of the second casing 102 and a side wall of the second casing 102. The third rotatable gear 153 can be rotatably fitted to the first rotation shaft 167, while the fourth rotatable gear 154 can be rotatably fitted to the second rotation shaft 168.

Figure 7:
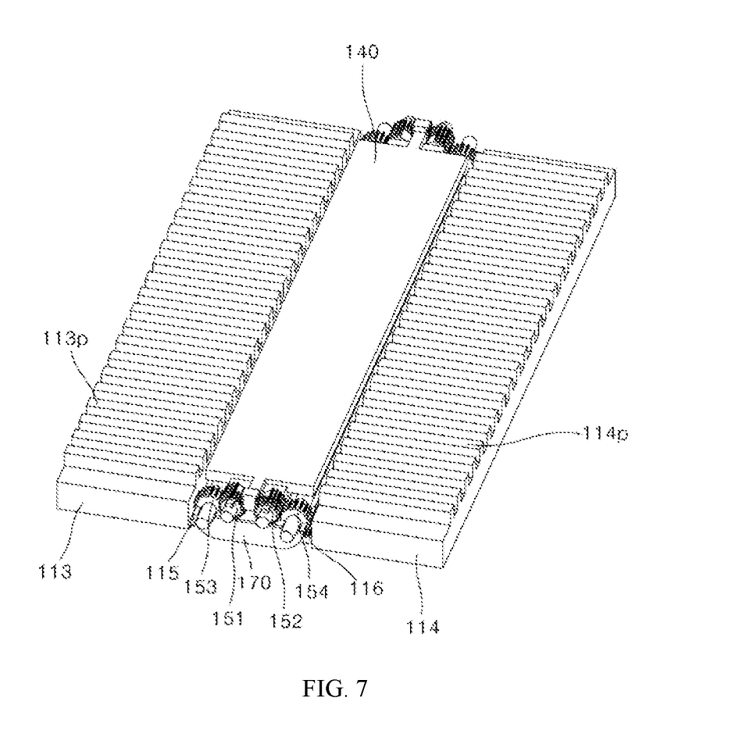
FIG. 7 is a perspective view showing an arrangement of supports and gears of a foldable display device according to one embodiment of the present disclosure in an unfolded state.

FIG. 7 is a perspective view showing an arrangement of supports and gears of a foldable display device according to one embodiment of the present disclosure in an unfolded state.

Referring to FIGS. 4 and 7, it will be appreciated by those skilled in the art that the structures as described above with reference to FIGS. 5 and 6 are respectively disposed on an opposite side of the first casing 101 and an opposite side of the second casing 102.

Referring to FIG. 7, an arrangement of the first peripheral support 113, the first rack gear 115, the second peripheral support 114, the second rack gear 116, the central support 140, the first rotatable gear 151, the second rotatable gear 152, the third rotatable gear 153, the fourth rotatable gear 154, and the hinge body 170 in the unfolded state will be well understood in three dimensions.

Figure 8:
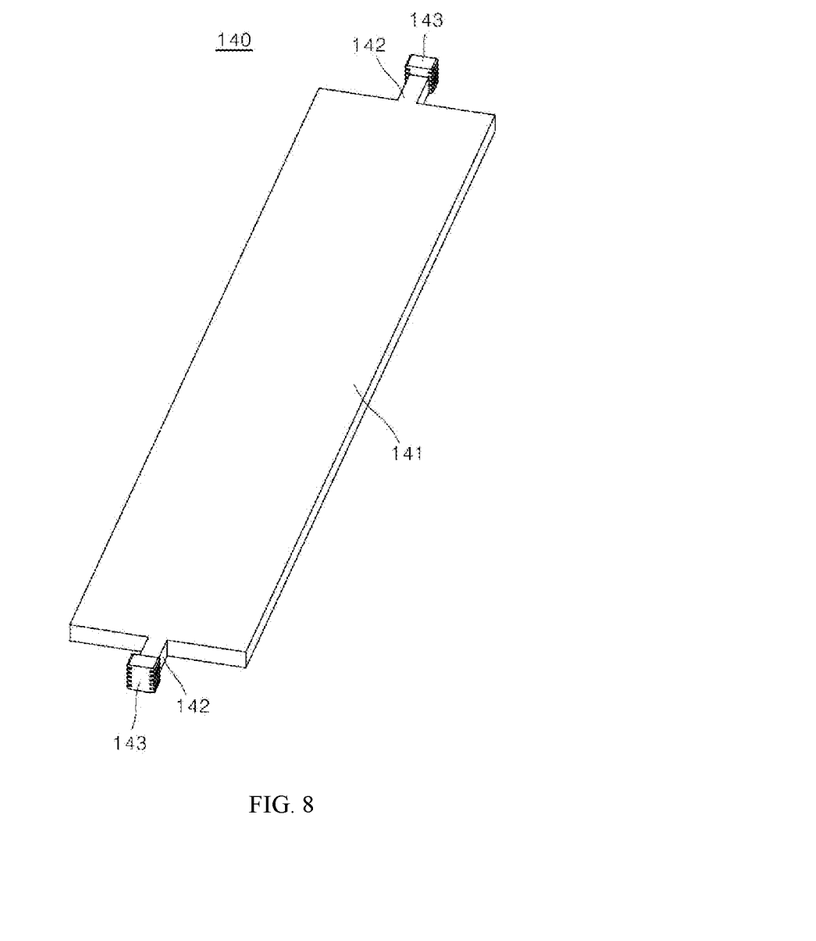
FIG. 8 is a perspective view showing a central support of a foldable display device according to one embodiment of the present disclosure.

FIG. 8 is a perspective view showing a central support of a foldable display device according to one embodiment of the present disclosure.

Referring to FIG. 8, the central support 140 according to one embodiment of the present disclosure includes a body 141 which has a flat top face and supports the foldable area 133 of the display panel 130 during the unfolding operation, a pair of gears 143 respectively provided on both opposing ends of the body 141 in a length direction of the central support 140 and having teeth formed in both opposing sides thereof in a width direction of the central support 140, and a pair of connectors 142 between the body 141 and the pair of gears 143, where each connector 142 connects each gear 143 to the body 141.

The gear 143 of the central support 140 is disposed between and is engaged with the first rotatable gear 151 and the second rotatable gear 152. The first rotatable gear 151 meshes with the teeth provided on one side face of the gear 143, while the second rotatable gear 152 is engaged with the teeth provided on the other side of the gear 143. This allows the central support 140 to move up and down according to the rotation direction of the first rotatable gear 151 and the second rotatable gear 152.

Figure 9:
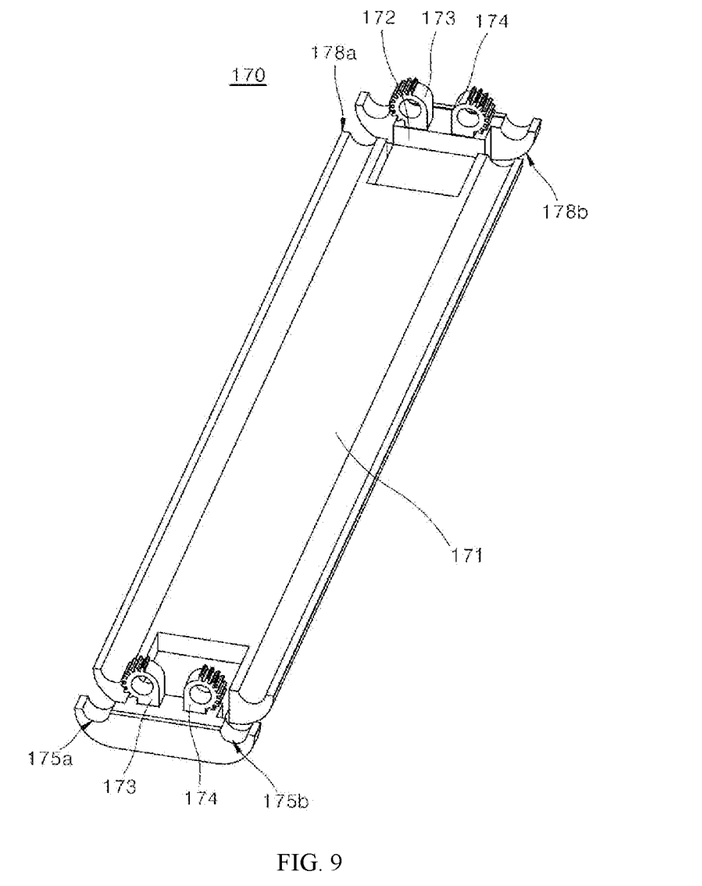
FIG. 9 is a perspective view showing a hinge body of a foldable display device according to one embodiment of the present disclosure.

FIG. 9 is a perspective view showing a hinge body of a foldable display device according to one embodiment of the present disclosure.

Referring to FIG. 9, the hinge body 170 includes a bottom portion 171 on which the central support 140 is seated during the in-folding operation, a pair of first hinge shaft supports 173 which protrude from the bottom portion 171 and into which the first hinge shafts 161 connected to the first casing 101 are respectively fitted, and a pair of second hinge shaft supports 174 which protrude from the bottom portion 171 and into which the second hinge shafts 162 connected to the second casing 102 are respectively fitted. Each of the first hinge shaft supports 173 can be equipped with a sector gear while each of the second hinge shaft supports 174 can be equipped with a sector gear. A first sector gear can be provided on an outer side of the first hinge shaft support 173, for example, one side thereof adjacent to the first casing 101. A second sector gear can be provided on an outer side of the second hinge shaft support 174, for example, one side thereof adjacent to the second casing 102.

A pair of first hinge shaft supports 173 are spaced apart from each other in a length direction of the hinge body 170 and are respectively arranged on both opposing ends of the bottom portion 171. A pair of second hinge shaft supports 174 are spaced apart from each other in the length direction of the hinge body 170 and are respectively arranged on both opposing ends of the bottom portion 171. The first hinge shaft support 173 and the second hinge shaft support 174 can be spaced apart from each other in the width direction of the hinge body 170. A spacing between the first hinge shaft support 173 and the second hinge shaft support 174 can correspond to a width of the connector 142 of the central support 140.

The bottom portion 171 of the hinge body 170 can include a groove 172 into which the hinge shaft fixing portion 163 is fitted, a first recess 175a that accommodates the first rotation shaft 167 in the unfolded state, a second recess 175b that accommodates the second rotation shaft 168 in the unfolded state, a first cut-away 178a in which the first rotatable gear 153 is accommodated in an unfolded state, and a second cut-away 178b in which the second rotatable gear 154 is accommodated in an unfolded state. The first recess 175a, and the first cut-away 178a can be disposed on a left side of one side (left side) of the groove 172, while the second recess 175b, and the second cut-away 178b can be disposed on the opposite side (right side) of the groove 172. A pair of first recesses 175a, a pair of first cut-aways 178a, a pair of grooves 172, a pair of second recesses 175b, and a pair of second cut-aways 178b can be provided. A pair of first recesses 175a can be spaced apart from each other in the length direction of the hinge body 170. A pair of first cut-aways 178a can be spaced apart from each other in the length direction of the hinge body 170. A pair of grooves 172 can be spaced apart from each other in the length direction of the hinge body 170. A pair of second recesses 175b can be spaced apart from each other in the length direction of the hinge body 170. A pair of second cut-aways 178b can be spaced apart from each other in the length direction of the hinge body 170.

Figure 10:
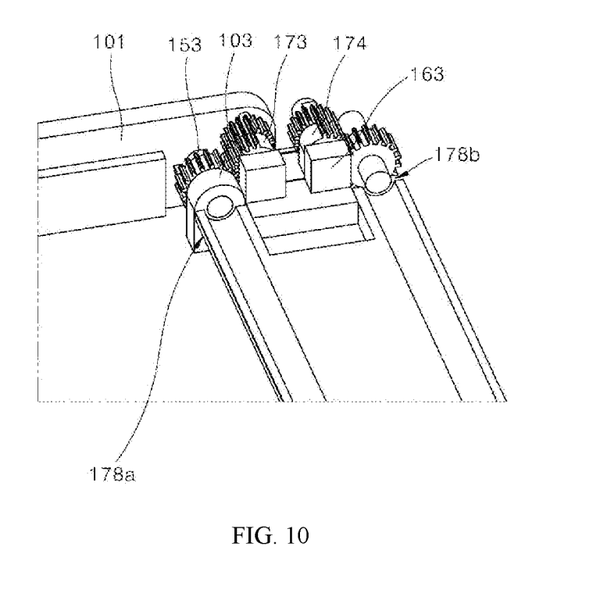
FIG. 10 is a perspective view showing an arrangement of a first casing and a hinge body of a foldable display device according to one embodiment of the present disclosure in an unfolded state.

FIG. 10 is a perspective view showing an arrangement of a first casing and a hinge body of a foldable display device according to one embodiment of the present disclosure in an unfolded state.

Referring to FIG. 10, it can be seen that the first rotatable gear 153 and the first rotation shaft support 103 of the first casing 101 are accommodated in the first cut-away 178a in the unfolded state. In the unfolded state, the second rotatable gear 154 and the second rotation shaft support 104 of the second casing 102 are accommodated in the second cut-away 178b. Referring to FIG. 2, one of ordinary skill in the art will appreciate that in the unfolded state, the first rack gear 115 extending from the first peripheral support 113 and meshing with the first rotatable gear 153 can be received in the first cut-away 178a, while the second rack gear 116 that extends from the second peripheral support 114 and engages with the second rotatable gear 154 can be accommodated in the second cut-away 178b.

Figure 11:
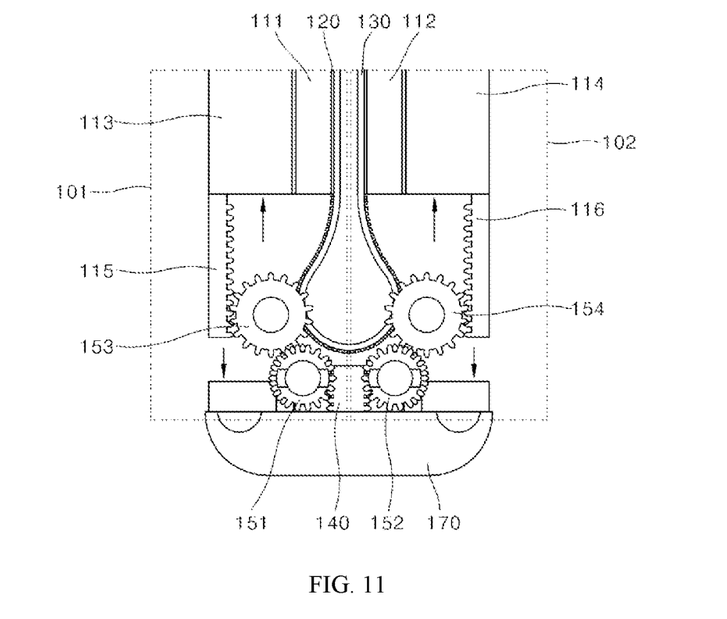
FIG. 11 is a side view of a portion of a foldable display device according to one embodiment of the present disclosure as viewed in an in-folded state.

FIG. 11 is a side view of a portion of a foldable display device according to one embodiment of the present disclosure as viewed in an in-folded state.

Referring to FIG. 11, in the in-folded state, the central support 140 does not support the display panel 130, and can descend toward the hinge body 170 and can be seated on the hinge body 170. Further, the first peripheral support 113 and the second peripheral support 114 move in a direction away from the central support 140. As a result, the display panel 130 can be gently bent in a 'Ω' shape and accommodated in a space created by the movements of the central support 140, the first peripheral support 113 and the second peripheral support 114.

Based on the drawing in FIG. 11, in the in-folding operation, in the process of pivoting the first casing 101 and second casing 102 around the hinge body 170 so that the display panel 130 is folded, the first rotatable gear 151 can rotate around the first hinge shaft 161 clockwise while the second rotatable gear 152 can rotate counterclockwise around the second hinge shaft 162, such that the central support 140 descends toward the hinge body 170. In the in-folding operation, the third rotatable gear 153 rotates clockwise around the first rotation shaft 167, such that the first peripheral support 113 connected to the first rack gear 115 moves away from the central support 140. Further, the fourth rotatable gear 154 rotates counterclockwise around the second rotation shaft 168, such that the second peripheral support 114 connected to the second rack gear 116 moves away from the central support 140.

Figure 12:
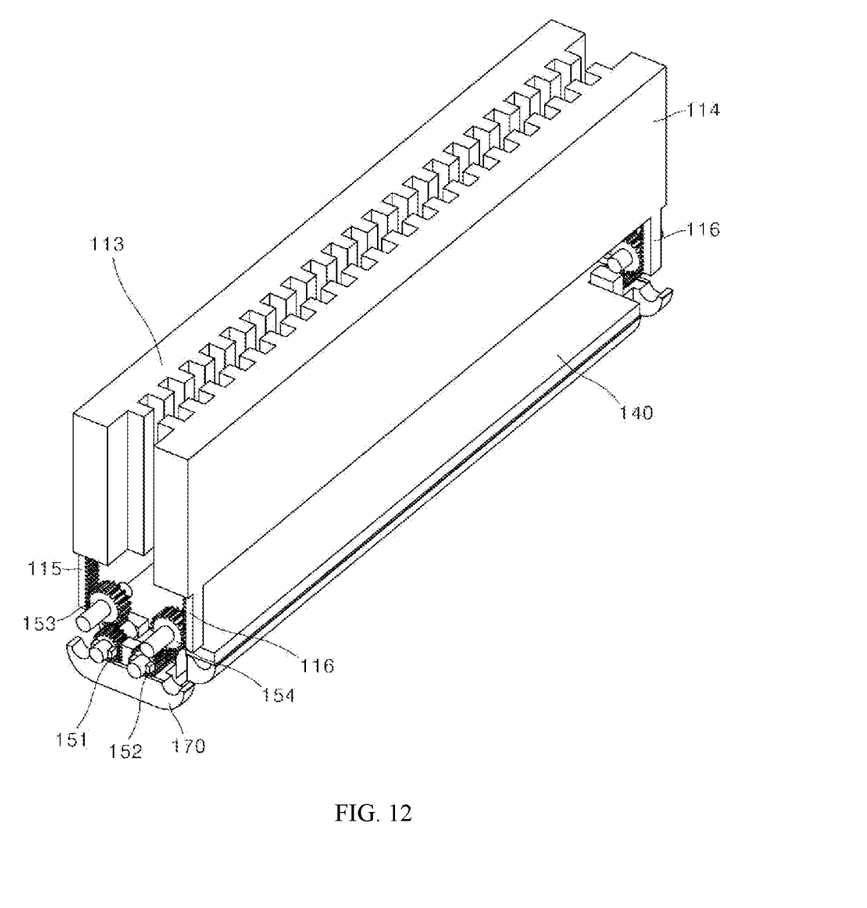
FIG. 12 is a perspective view showing an arrangement of supports and gears of a foldable display device according to one embodiment of the present disclosure in an in-folded state.

FIG. 12 is a perspective view showing an arrangement of supports and gears of a foldable display device according to one embodiment of the present disclosure in an in-folded state.

Referring to FIG. 12, an arrangement of the first peripheral support 113, the first rack gear 115, the second peripheral support 114, the second rack gear 116, the central support 140, the first rotatable gear 151, the second rotatable gear 152, the third rotatable gear 153, the fourth rotatable gear 154 and the hinge body 170 in the in-folded state can be understood in three dimensions.

Figure 13:
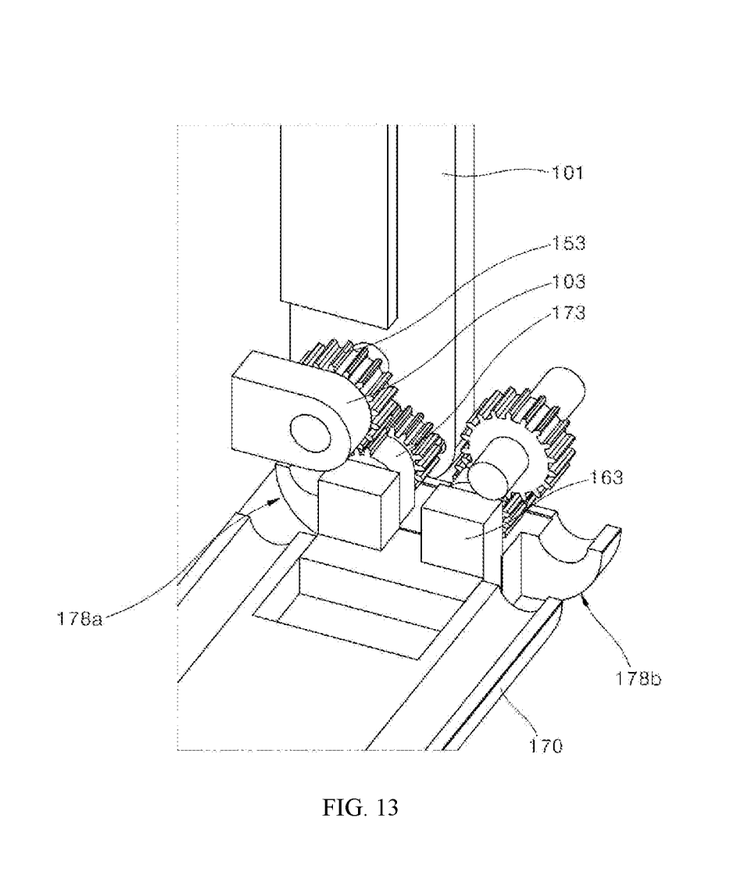
FIG. 13 is a perspective view showing an arrangement of a first casing and a hinge body of a foldable display device according to one embodiment of the present disclosure in an in-folded state.

FIG. 13 is a perspective view showing an arrangement of a first casing and a hinge body of a foldable display device according to one embodiment of the present disclosure in an in-folded state.

Referring to FIG. 13, it can be seen that the first rotatable gear 153 and the first rotation shaft support 103 of the first casing 101 are deviated from the first cut-away 178a in the in-folded state. In the in-folded state, the second rotatable gear 154 and the second rotation shaft support 104 of the second casing 102 are deviated from the second cut-away 178b. Referring to FIG. 11, one skilled in the art will notice that in the in-folded state, the first rack gear 115 extending from the first peripheral support 113 and engaging with the first rotatable gear 153 can be separated from the first cut-away 178a, while the second rack gear 116 extending from the second peripheral support 114 and engaging with the second rotatable gear 154 can be separated from the second cut-away 178b.

One or more embodiments of the present disclosure can be described as follows.

A first aspect of the present disclosure provides a foldable display device comprising a display panel having a first area, a second area, and a foldable area therebetween; a first support plate supporting the first area of the display panel; a second support plate supporting the second area of the display panel; a central support disposed under the foldable area of the display panel and configured to move vertically; a first peripheral support slidable while supporting the first support plate; a second peripheral support slidable while supporting the second support plate; and a hinge body disposed under the central support, wherein the central support ascends toward the display panel during an unfolding operation and descends toward the hinge body during an in-folding operation, wherein the first peripheral support and the second peripheral support move toward the central support during the unfolding operation, and move away from the central support during the in-folding operation.

In one implementation of the first aspect, the central support includes a body having a flat top face and supporting the foldable area of the display panel during the unfolding operation; a pair of gears spaced apart from each other and respectively disposed on both opposing ends of the body in a length direction of the central support, wherein each of the pair of gears has teeth formed on each of both opposing sides thereof in a width direction of the central support; and a pair of connectors between the body and the pair of gears, where each connector connects each gear to the body.

In one implementation of the first aspect, the device further comprises a pair of first rotatable gears rotating according to a pivoting motion of a first casing accommodating the first peripheral support, wherein each of the pair of first rotatable gears engages with the teeth of one side of each of the gears of the central support; and a pair of second rotatable gears rotating according to a pivoting motion of a second casing accommodating the second peripheral support, wherein each of the pair of second rotatable gears engages with the teeth of the other side of each of the gears of the central support.

In one implementation of the first aspect, each of the pair of first rotatable gears is rotatably fitted to a first hinge shaft coupled to the first casing, wherein each of the pair of second rotatable gears is rotatably fitted to a second hinge shaft connected to the second casing.

In one implementation of the first aspect, each of the first hinge shaft and the second hinge shaft extends from a hinge shaft fixing portion received in the hinge body.

In one implementation of the first aspect, the hinge body includes a bottom portion on which the central support is seated during the in-folding operation; a pair of first hinge shaft supports protruding from the bottom portion, wherein a first hinge shaft passes through each of the first hinge shaft supports; and a pair of second hinge shaft supports protruding from the bottom portion, wherein a second hinge shaft passes through each of the second hinge shaft supports, wherein each of the first hinge shaft supports has a first sector gear, while each of the second hinge shaft supports has a second sector gear.

In one implementation of the first aspect, the device further comprises a pair of third rotatable gears rotatably coupled to the first casing receiving the first peripheral support, wherein each of the pair of third rotatable gears meshes with the first sector gear of each first hinge shaft support; and a pair of fourth rotatable gears rotatably coupled to the second casing receiving the second peripheral support, wherein each of the pair of fourth rotatable gears meshes with the second sector gear of each second hinge shaft support.

In one implementation of the first aspect, the device further comprises a pair of first rack gears extending from the first peripheral support and respectively meshing with the third rotatable gears; and a pair of second rack gears extending from the second peripheral support and respectively meshing with the fourth rotatable gears.

A second aspect of the present disclosure provides a foldable display device comprising a display panel having a first area, a second area, and a foldable area therebetween; a central support disposed under the foldable area of the display panel and configured to move vertically; a first peripheral support slidably disposed on one side of the central support; a second peripheral support slidably disposed on an opposite side of the central support; and a hinge body disposed under the central support, wherein the central support ascends toward the display panel during an unfolding operation and descends toward the hinge body during an in-folding operation, wherein the first peripheral support and the second peripheral support move toward the central support during the unfolding operation and move away from the central support during the in-folding operation.

In one implementation of the second aspect, the device further comprises a first rotatable gear fixed to a first casing accommodating the first peripheral support and rotating according to a pivoting motion of the first casing; and a second rotatable gear fixed to a second casing accommodating the second peripheral support and rotating according to a pivoting motion of the second casing, wherein the central support ascends or descends via the first rotatable gear and the second rotatable gear.

In one implementation of the second aspect, the central support includes a body for supporting the foldable area of the display panel; a pair of gears respectively disposed on both opposing ends of the body in a length direction of the central support, wherein the pair of gears are respectively engaged with the first rotatable gear and the second rotatable gear; and a pair of connectors between the body and the pair of gears, where each connector connecting each gear to the body.

In one implementation of the second aspect, the device further comprises a first rack gear extending from the first peripheral support toward the hinge body; and a second rack gear extending from the second peripheral support toward the hinge body.

In one implementation of the second aspect, the device further comprises a third rotatable gear rotatably coupled to a first casing accommodating the first peripheral support and meshing with the first rack gear; and a fourth rotatable gear rotatably coupled to a second casing accommodating the second peripheral support, and meshing with the second rack gear.

In one implementation of the second aspect, the hinge body includes a bottom portion on which the central support is seated during the in-folding operation; a first hinge shaft support protruding from the bottom portion, wherein a first hinge shaft connected to the first casing is fitted into the first hinge shaft support; and a second hinge shaft support protruding from the bottom portion, wherein a second hinge shaft connected to the second casing is fitted into the second hinge shaft support, wherein a first sector gear meshing with the third rotatable gear is disposed on one side of the first hinge shaft support, wherein a second sector gear meshing with the fourth rotatable gear is disposed on one side of the second hinge shaft support.

Although the embodiments of the present disclosure have been described in more detail with reference to the accompanying drawings, the present disclosure is not necessarily limited to these embodiments. The present disclosure can be implemented in various modified manners within the scope not departing from the technical idea of the present disclosure. Accordingly, the embodiments disclosed in the present disclosure are not intended to limit the technical idea of the present disclosure, but to describe the present disclosure. the scope of the technical idea of the present disclosure is not limited by the embodiments.

Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. A foldable display device, comprising:
a display panel having a first area, a second area, and a foldable area between the first and second areas;
a first support plate supporting the first area of the display panel;
a second support plate supporting the second area of the display panel;
a central support disposed under the foldable area of the display panel, the central support overlapping the foldable area of the display panel in a vertical direction and configured to move in the vertical direction; and
a backplate layer supporting the display panel,
wherein in an in-folded state, each of the display panel and the backplate layer includes at least one first curved portion having a positive curvature and at least one second curved portion having a negative curvature,
wherein the central support includes:
   a body having a flat top face and supporting the foldable area of the display panel during an unfolding operation;
   a pair of gears spaced apart from each other and respectively disposed on opposing ends of the body in a length direction of the central support; and
   a pair of connectors disposed between the body and the pair of gears,
wherein each of the pair of gears has teeth formed on each of opposing sides in a width direction of the central support,
wherein each of the pair of connectors connects each of the pair of gears to the body, and
wherein the body of the central support overlaps the foldable area of the display panel in the vertical direction and extends substantially an entire width of the display panel in the length direction of the central support.

2. The foldable display device of claim 1, wherein the backplate layer includes a patterned portion overlapping the foldable area of the display panel.

3. The foldable display device of claim 1, further comprising at least four rotatable gears under the foldable area of the display panel.

4. The foldable display device of claim 1, further comprising:
   a first peripheral support slidable while supporting the first support plate;
   a second peripheral support slidable while supporting the second support plate; and
   a hinge body disposed under the central support,
wherein the central support ascends toward the display panel during the unfolding operation and descends toward the hinge body during an in-folding operation, and
wherein the first peripheral support and the second peripheral support move toward the central support during the unfolding operation, and move away from the central support during the in-folding operation.

5. The foldable display device of claim 1, further comprising:
   a pair of first rotatable gears rotating according to a pivoting motion of a first casing accommodating a first peripheral support, wherein each of the pair of first rotatable gears engages with the teeth of one side of each of the pair of gears of the central support; and
   a pair of second rotatable gears rotating according to a pivoting motion of a second casing accommodating a second peripheral support, wherein each of the pair of second rotatable gears engages with the teeth of another side of each of the pair of gears of the central support.

6. The foldable display device of claim 5, wherein each of the pair of first rotatable gears is rotatably fitted to a first hinge shaft coupled to the first casing, and
   wherein each of the pair of second rotatable gears is rotatably fitted to a second hinge shaft connected to the second casing.

7. The foldable display device of claim 6, wherein each of the first hinge shaft and the second hinge shaft extends from a hinge shaft fixing portion received in a hinge body.

8. The foldable display device of claim 4, wherein the hinge body includes:
   a bottom portion on which the central support is seated during the in-folding operation;
   a pair of first hinge shaft supports protruding from the bottom portion, wherein a first hinge shaft passes through each of the first hinge shaft supports; and
   a pair of second hinge shaft supports protruding from the bottom portion, wherein a second hinge shaft passes through each of the second hinge shaft supports, and
   wherein each of the first hinge shaft supports has a first sector gear, while each of the pair of second hinge shaft supports has a second sector gear.

9. The foldable display device of claim 8, further comprising:
   a pair of third rotatable gears rotatably coupled to a first casing receiving the first peripheral support, wherein each of the pair of third rotatable gears meshes with the first sector gear of each first hinge shaft support; and
   a pair of fourth rotatable gears rotatably coupled to a second casing receiving the second peripheral support, wherein each of the pair of fourth rotatable gears meshes with the second sector gear of each second hinge shaft support.

10. The foldable display device of claim 9, further comprising:
   a pair of first rack gears extending from the first peripheral support and respectively meshing with the pair of third rotatable gears; and
   a pair of second rack gears extending from the second peripheral support and respectively meshing with the pair of fourth rotatable gears.

11. A foldable display device, comprising:
   a display panel having a first area, a second area, and a foldable area between the first and second areas;
   a central support disposed under the foldable area of the display panel, the central support overlapping the foldable area of the display panel in a vertical direction and configured to move in the vertical direction; and
   a backplate layer supporting the display panel,
wherein in an in-folded state, each of the display panel and the backplate layer includes at least one first curved portion having a positive curvature and at least one second curved portion having a negative curvature,
wherein the central support includes:
   a body configured to support the foldable area of the display panel;
   a pair of gears respectively disposed on opposing ends of the body in a length direction of the central support; and
   a pair of connectors between the body and the pair of gears,
wherein the pair of gears are respectively engaged with a first rotatable gear and a second rotatable gear,
wherein each of the pair of connectors connects each of the pair of gears to the body, and
wherein the body of the central support has a substantially flat top face, and overlaps the foldable area of the display panel in the vertical direction and extends substantially an entire width of the display panel in the length direction of the central support.

12. The foldable display device of claim 11, further comprising:

a first peripheral support slidably disposed on a first side of the central support;

a second peripheral support slidably disposed on a second side of the central support opposite to the first side of the central support; and a hinge body disposed under the central support, wherein the central support ascends toward the display panel during an unfolding operation and descends toward the hinge body during an in-folding operation, and wherein the first peripheral support and the second peripheral support move toward the central support during the unfolding operation and move away from the central support during the in-folding operation.

13. The foldable display device of claim 12, wherein the first rotatable gear is fixed to a first casing accommodating the first peripheral support and rotates according to a pivoting motion of the first casing, wherein the second rotatable gear is fixed to a second casing accommodating the second peripheral support and rotates according to a pivoting motion of the second casing, and wherein the central support ascends or descends via the first rotatable gear and the second rotatable gear.

14. The foldable display device of claim 11, further comprising:

a first rack gear extending from a first peripheral support toward a hinge body; and a second rack gear extending from a second peripheral support toward the hinge body.

15. The foldable display device of claim 14, further comprising:

a third rotatable gear rotatably coupled to a first casing accommodating the first peripheral support and meshing with the first rack gear; and a fourth rotatable gear rotatably coupled to a second casing accommodating the second peripheral support, and meshing with the second rack gear.

16. The foldable display device of claim 15, wherein the hinge body includes:

a bottom portion on which the central support is seated during an in-folding operation;

a first hinge shaft support protruding from the bottom portion, wherein a first hinge shaft connected to the first casing is fitted into the first hinge shaft support; and a second hinge shaft support protruding from the bottom portion, wherein a second hinge shaft connected to the second casing is fitted into the second hinge shaft support, wherein a first sector gear meshing with the third rotatable gear is disposed on one side of the first hinge shaft support, and wherein a second sector gear meshing with the fourth rotatable gear is disposed on one side of the second hinge shaft support.

* * * * *